(12) United States Patent
Liao

(10) Patent No.: US 6,303,465 B1
(45) Date of Patent: Oct. 16, 2001

(54) METHOD OF FORMING LOW LEAKAGE CURRENT BORDERLESS CONTACT

(75) Inventor: Wei-Wu Liao, Jui-Feng Chen (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/344,473

(22) Filed: Jun. 25, 1999

(51) Int. Cl.[7] .................................................. H01L 21/76
(52) U.S. Cl. ......................... 438/424; 438/400; 257/344
(58) Field of Search .................................. 438/400, 424, 438/429, 430, 584, 497, 669, 672; 257/344

(56) References Cited

U.S. PATENT DOCUMENTS 6,018,180 * 1/2000 Cheek et al. ........................ 257/344
6,074,927 * 6/2000 Kepler et al. ....................... 438/400
6,133,105 * 10/2000 Chen et al. ......................... 438/296

* cited by examiner

*Primary Examiner*—Richard Elms
*Assistant Examiner*—Christian D. Wilson

(57) ABSTRACT

A method for fabricating a borderless contact is disclosed. The method includes providing a substrate with an active region and a trench formed therein. Then, the trench is etched to stop at a depth. A conformal stop layer is deposited on the substrate. As a key step, the stop layer is etched to form spacer against top corner of the trench. A dielectric layer is formed on the substrate. Then, an opening is etched in the dielectric layer to form a borderless contact, wherein the opening overlies both a portion of the trench and a portion of the active region.

12 Claims, 4 Drawing Sheets

METHOD OF FORMING LOW LEAKAGE CURRENT BORDERLESS CONTACT

BACKGROUND OF THE INVENTION

1. Field of the Invention

The present invention relates to semiconductor manufacturing in general, and more specifically to methods for forming low leakage current borderless contact.

2. Description of the Prior Art

The major objectives of the semiconductor industry have been to continually increase the device and circuit performances of silicon chips, while maintaining or even decreasing the cost of producing these same silicon chips. These objectives have been successfully addressed by the ability of the semiconductor industry to fabricate silicon devices, with sub-micron features. The ability to use sub-micron features, or micro-miniaturization, has allowed performance improvements to be realized by the reduction of resistances and parasitic capacitances, resulting from the use of smaller features. In addition, the use of sub-micron features results in smaller silicon chips with increased circuit densities, thus allowing more silicon chips to be obtained from a starting silicon substrate, thus reducing the cost of an individual silicon chip.

The attainment of micro-miniaturization has been basically a result of advances in specific semiconductor fabrication disciplines, such as photolithography and reactive ion etching. The development of more sophisticated exposure cameras, as well as the use of more sensitive photoresist materials, have allowed sub-micron features in photoresist layers to be routinely achieved. In addition, similar developments in the dry etching discipline have allowed these sub-micron images in photoresist layers to be successfully transferred to underlying materials, which are used for the creation advanced semiconductor devices. However, the use of sub-micron features can improve silicon device performance and decrease silicon chip coast, but will introduce specific semiconductor fabrication problems and will not encounter with larger featured counterparts. For example, specific designs, which are used to connect and overlying metallization structure to an underlying metallization structure, sometimes require that metal filled via holes in insulator layers, and not always be fully landed. That is the result of the metal filled via not being placed entirely on the underlying metallization structure. The inability of fully land a via on an underlying metal structure, places a burden on the process used to create the via hole. For example if the chip design demands a non-fully landed, or has a borderless contact, the dry etching procedure used to create the via has to be able to insure complete removal of insulator materials from the area where the via landed on the underlying metal structure. Therefore, the dry etching procedure necessitates the use of an overetch cycle.

However, overetching can create problems. FIG. 1A to FIG. 1D are schematic representations of structures at various stages during the formulation of borderless contact using conventional, prior art techniques. A substrate 100 is provided with a source/drain junction 110 formed therein, as shown in FIG. 1A. A shallow trench isolation (STI) 120 is formed beside the junction 110. Then, a silicon nitride layer 140 is deposited on the substrate 100 as a stop layer, as shown in FIG. 1B. A planarized interlevel dielectric layer 150 is subsequently formed over the stop layer 140. The formulation of contact includes two etching steps, i.e.; etching interlevel dielectric layer 150 is the first and etching stop layer 140 is the second. FIG. 1C shows the first step and FIG. 1D shows the second step. While in the second step, the selectivity between silicon nitride and silicon oxide is about 1.5:1. This will make overetching on top surface of STI 120 near bottom of junction 110, and leakage current will occur between side wall of STI 20 and substrate 100 when tungsten or copper plug filling the contact 160, as shown in FIG. 1D.

SUMMARY OF THE INVENTION

In accordance with the present invention, a method is provided for forming borderless contact that substantially prevents from leakage current caused by overetching of interlevel dielectric.

In one embodiment, a substrate is provided with an active region and a trench formed therein. Then, the trench is etched to stop at a depth. A conformal silicon oxide layer is deposited on the substrate, and a conformal stop layer is subsequently deposited over the silicon oxide layer. As a key step, the stop layer is etched to form spacer against top corner of the trench. Then, a planarized dielectric layer is formed on the substrate. and an opening is etched in the dielectric layer to form borderless contact, wherein the opening overlies both a portion of the trench and a portion of the active region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
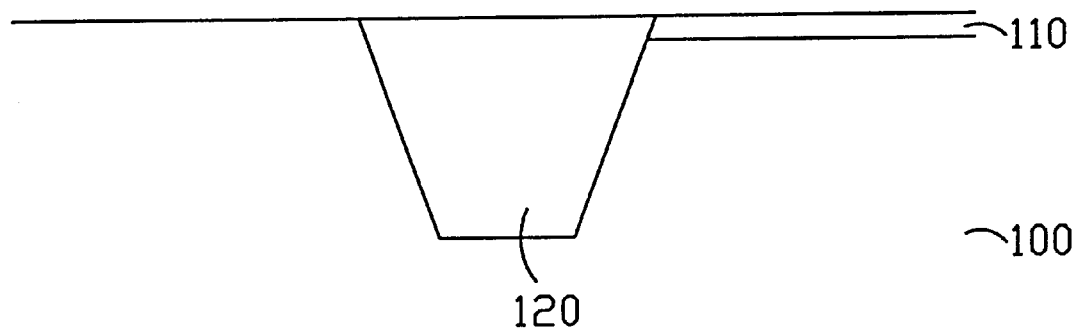
FIGS. 1A to 1D are schematic representations of structures at various stages during the formulation of borderless contact using conventional, prior art techniques.
Figure 1B:
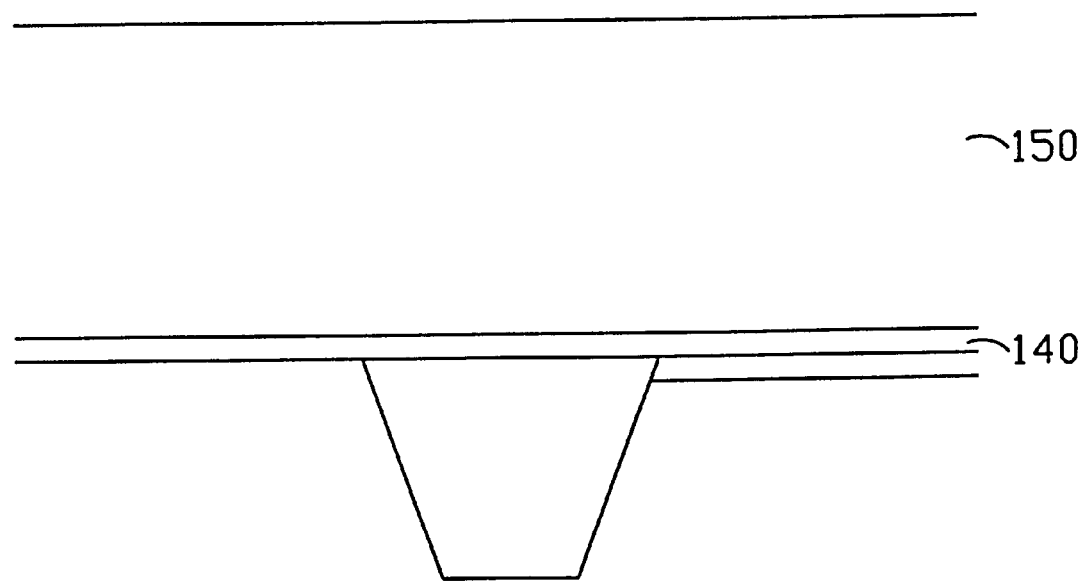
Figure 1C:
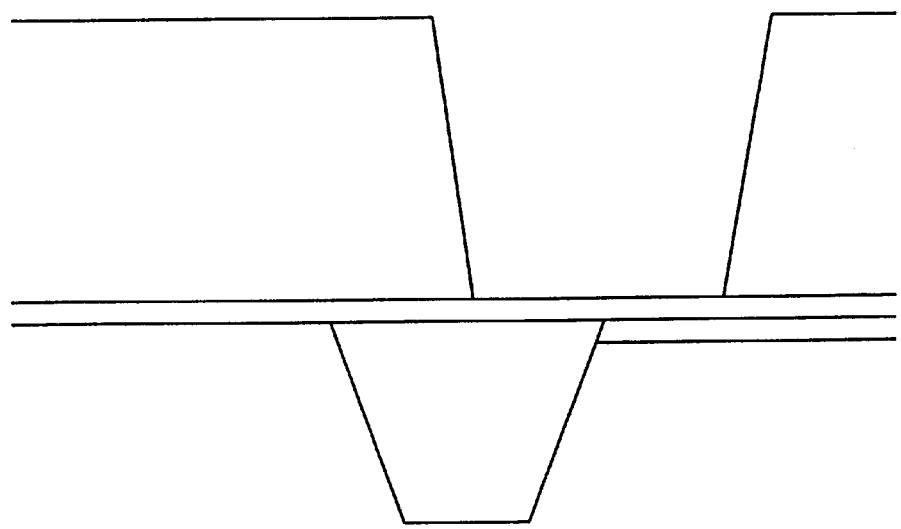
Figure 1D:
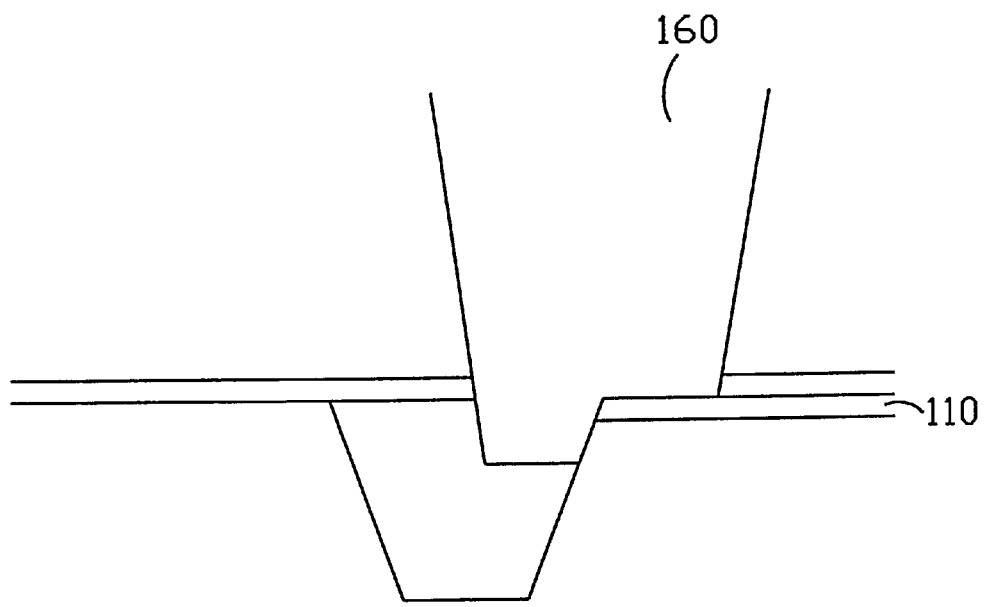
Figure 2A:
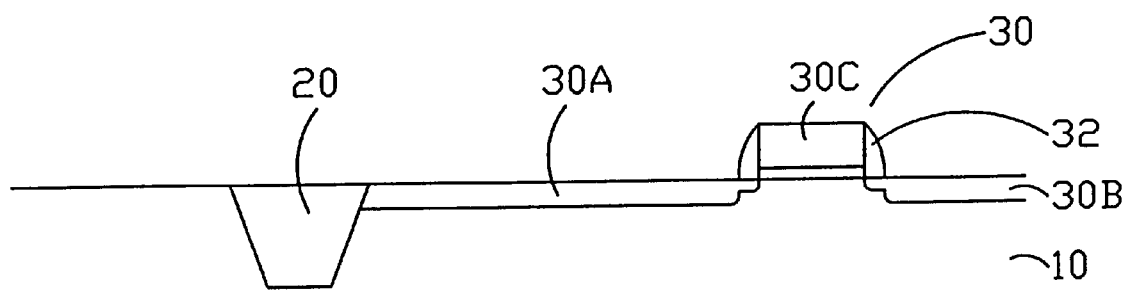
FIGS. 2A to 2F are schematic representations of structures at various stages during the formulation of borderless contact in accordance with a method disclosed.

Referring to FIG. 2A, a semiconductor substrate 10 is provided on and in which are formed the semiconductor devices, such as MOSFET 30. The most commonly used substrate in the semiconductor industry is composed of single crystal silicon. However, the method is also applicable to other types of substrates where electrical interconnections are desirable. In this embodiment, MOSFET 30 has a source 30A, drain 30B and a gate 30C formed in and on the substrate 10. Spacer 32 is formed beside the gate 30C. A shallow trench isolation (STI) 20 is formed between semiconductor devices in substrate 10. Any conventionally used trench isolation material can be used for STI 20. In preferred forms of this invention, material of STI 20 is a CVD deposited tetra-ethyl-ortho-silicate (TEOS), deposited with or without plasma enhancement. Silicon nitride, silicon oxynitride, tantalum pentoxide, germanium oxide, aluminum oxide, zirconium oxide, titanium oxide and the like, are also suitable isolation materials.

Figure 2B:
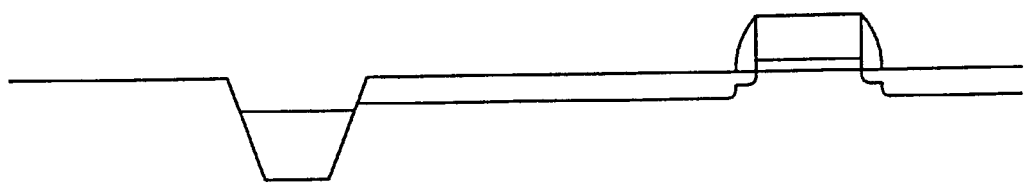

As illustrated in FIG. 2B, STI 20 is etched to a depth about junction depth of the source 30A/drain 30B. This etching is preformed by using any conventional method, such as reactive ion etching or wet etching. In one embodiment, the etching depth is between about 500 to 2000 angstroms.

Figure 2C:
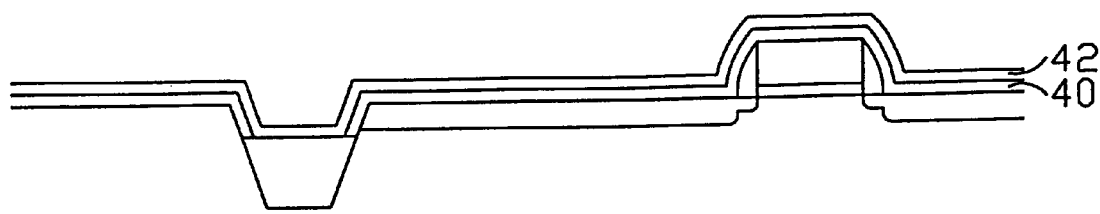

As indicated by FIG. 2C, a conformal silicon oxide layer 40 is formed using any suitable method, such as chemical vapor deposition or furnace treatment. This silicon oxide layer 40 is used as a buffer/pad layer and the thickness of this layer is between about 50 to 500 angstroms. Then, a conformal stop layer 42 is formed over the buffer layer 40. The material of this stop layer 42 may be silicon nitride or silicon oxynitride formed by using any conventional deposition method and the thickness of this layer 42 is between about 100 to 2000 angstroms. Any other materials of this layer 42 may be chosen as long as it demonstrates perfect selectivity when etching silicon oxide and other interlevel layer.

Figure 2D:
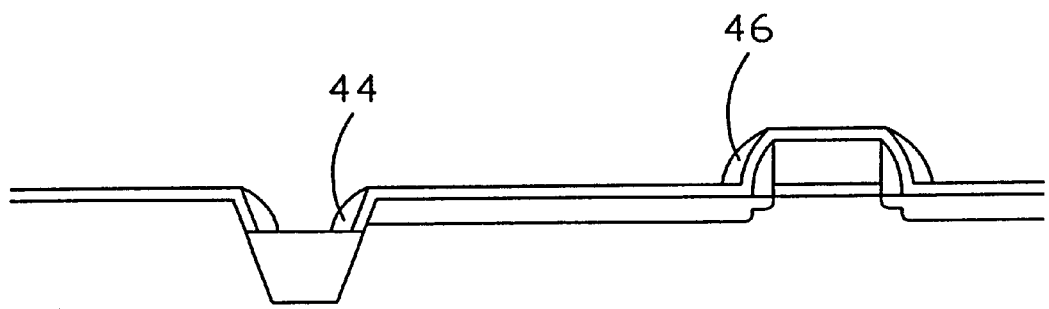
Figure 2E:
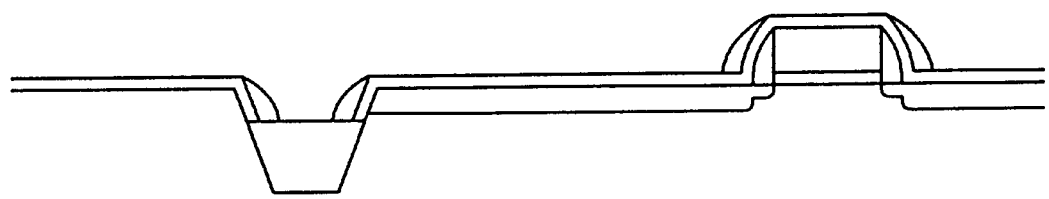

As a key step, an anisotropically etching stop layer 42 is performed to form spacer 44 against top corner of STI 20 by using any suitable etching method, as shown in FIG. 2D. Similarly, another spacer 46 is formed beside gate 30C but will not effect semiconductor device operation. The surface of the buffer layer 40 may be etched due to overetching the stop layer 42. However, after an interlevel dielectric layer 50 is formed, the shape of top surface of buffer layer 40 is not important, as shown in FIG. 2E. This interlevel dielectric layer 50 is deposited and can be a silicon oxide, a phosphorus glass (PSG), boronphosphorus glass (BPSG), or low pressure chemical vapor deposited (LPCVD) TEOS. Then, the interlevel dielectric layer 50 is planarized by using any conventional method, such as chemical mechanical polishing.

Figure 2F:
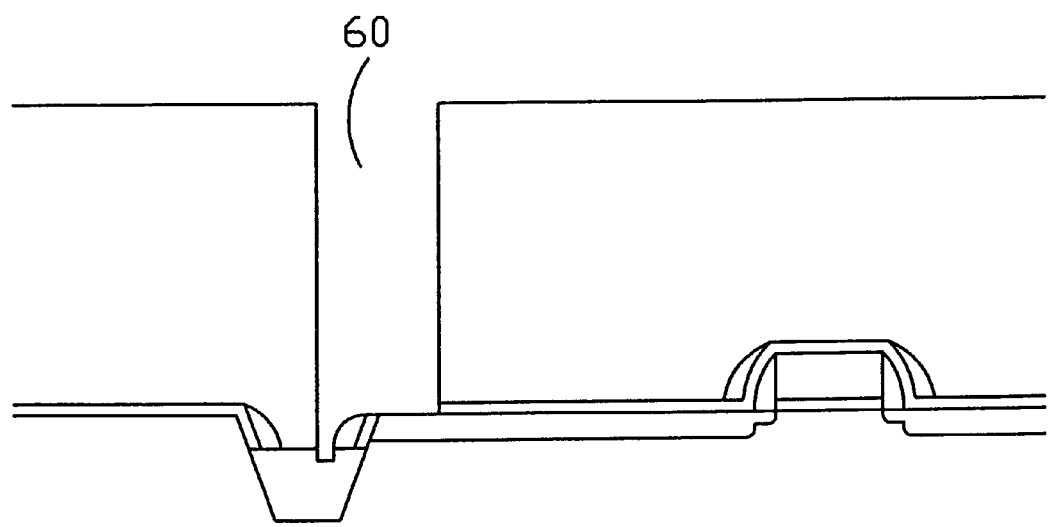

Referring to FIG. 2F, a borderless contact 60 is formed by using suitable method, such as conventional anisotropical dry etching. The contact 60 overlies both a portion of source 30A and a portion of STI 20. The spacer 44 formed from stop layer 42 here prevents from overetching to protect the junction between STI 20 and source 30A.

Although specific embodiments have been illustrated and described, it will be obvious to those skilled in the art that various modifications may be made without departing from what is intended to be limited solely by the appended claims.

What is claimed is:

1. A method for fabricating a borderless contact, the method comprising:
   providing a substrate having an active region and a filed trench isolation region;
   removing a portion of said trench isolation region;
   depositing a conformal stop layer on said substrate, said trench isolation region and said active region;
   etching said stop layer to form spacer against top corner of said trench isolation region;
   forming a dielectric layer on said substrate, said trench isolation region and said active region; and
   etching an opening in said dielectric layer, wherein said opening overlies both a portion of said trench isolation region and a portion of said active region.

2. The method according to claim 1, wherein depth of said removed trench isolation region is about the junction depth of said active region.

3. The method according to claim 1, further comprising a conformal silicon oxide layer formed under said stop layer.

4. The method according to claim 1, wherein said stop layer comprises silicon nitride.

5. The method according to claim 1, wherein said stop layer comprises silicon oxynitride.

6. The method according to claim 1, wherein said dielectric layer is planarized.

7. A method for fabricating a borderless contact, said method comprising:
   providing a substrate having an active region and a filled trench isolation region;
   removing a portion of said trench isolation region of a thickness approximately equal to junction depth of said active region;
   depositing a conformal silicon oxide layer on said substrate, said trench isolation region and said active region;
   depositing a conformal stop layer over said silicon oxide layer;
   etching said stop layer to form spacer against top corner of said trench isolation region;
   forming a planarized dielectric layer on said substrate, said trench isolation region and said active region; and
   etching an opening in said dielectric layer, wherein said opening overlies both a portion of said trench isolation region and a portion of said active region.

8. The method according to claim 7, wherein said stop layer comprises silicon nitride.

9. The method according to claim 7, wherein said stop layer comprises silicon oxynitride.

10. A method for fabricating low-leakage borderless contact in semiconductor device, said method comprising:
    providing a substrate having a MOSFET formed in and on said substrate;
    forming a filled shallow trench isolation region beside said MOSFET;
    removing a portion of said trench isolation region of a thickness approximately equal to junction depth of said MOSFET;
    forming a conformal silicon oxide layer on said substrate, said shallow trench isolation region and said MOSFET;
    depositing a conformal stop layer over said silicon oxide layer;
    etching said stop layer to form a spacer against top corner of said shallow trench isolation region;
    forming a planarized dielectric layer on said substrate, said shallow trench isolation region and said MOSFET; and
    etching an opening in said dielectric layer, wherein said opening overlies both a portion of said trench and a portion of said active region.

11. The method according to claim 10, wherein said stop layer comprises silicon nitride.

12. The method according to claim 10, wherein said stop layer comprises silicon oxynitride.

* * * * *